(12) United States Patent
Van Bilsen

(10) Patent No.: US 7,414,722 B2
(45) Date of Patent: Aug. 19, 2008

(54) ALIGNMENT MEASUREMENT ARRANGEMENT AND ALIGNMENT MEASUREMENT METHOD

(75) Inventor: Franciscus Bernardus Maria Van Bilsen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 423 days.

(21) Appl. No.: 11/204,380

(22) Filed: Aug. 16, 2005

(65) Prior Publication Data
US 2007/0041015 A1 Feb. 22, 2007

(51) Int. Cl.
*G01B 11/00* (2006.01)
(52) U.S. Cl. ...................... 356/401; 356/400
(58) Field of Classification Search ................. 356/399, 356/400, 401; 430/22, 5
See application file for complete search history.

(56) References Cited

U.S. PATENT DOCUMENTS

| 6,744,512 | B2* | 6/2004 | Takahashi | 356/401 |
| 7,265,841 | B2* | 9/2007 | Matsumoto | 356/401 |
| 2005/0195398 | A1* | 9/2005 | Adel et al. | 356/401 |

OTHER PUBLICATIONS

N.R. Farrar et al., Integrated Circuit Metrology, Inspection and Process Control VI, SPIE vol. 1673, (1992), p. 369-380.

K. Ota et al., Optical/Laser Microlithography IV, SPIE, vol. 1463, (1991), p. 304-314.

\* cited by examiner

*Primary Examiner*—L. G. Lauchman
(74) *Attorney, Agent, or Firm*—Pillsbury Winthrop Shaw Pittman LLP

(57) ABSTRACT

The invention provides an alignment measurement arrangement having a broadband source, an optical system and a detector. The broadband source is arranged to generate a radiation beam with a first and second range of wavelengths. The optical system is arranged to receive the generated radiation beam, produce an alignment beam, direct the alignment beam to a mark located on an object, to receive alignment radiation back from the mark, and to transmit the alignment radiation. The detector is arranged to receive the alignment radiation and to detect an image of the alignment mark located on the object. The detector furthermore produces a first and a second alignment signal, respectively, associated with said first and second range of wavelengths, respectively. The alignment measurement arrangement finally has a processor, which is connected to the detector. The processor is arranged to receive the first and second alignment signal, to determine a first and second signal quality respectively of the first and second alignment signal respectively by using a signal quality indicating parameter, and to calculate a position of the alignment mark based on the first and second signal quality.

28 Claims, 13 Drawing Sheets

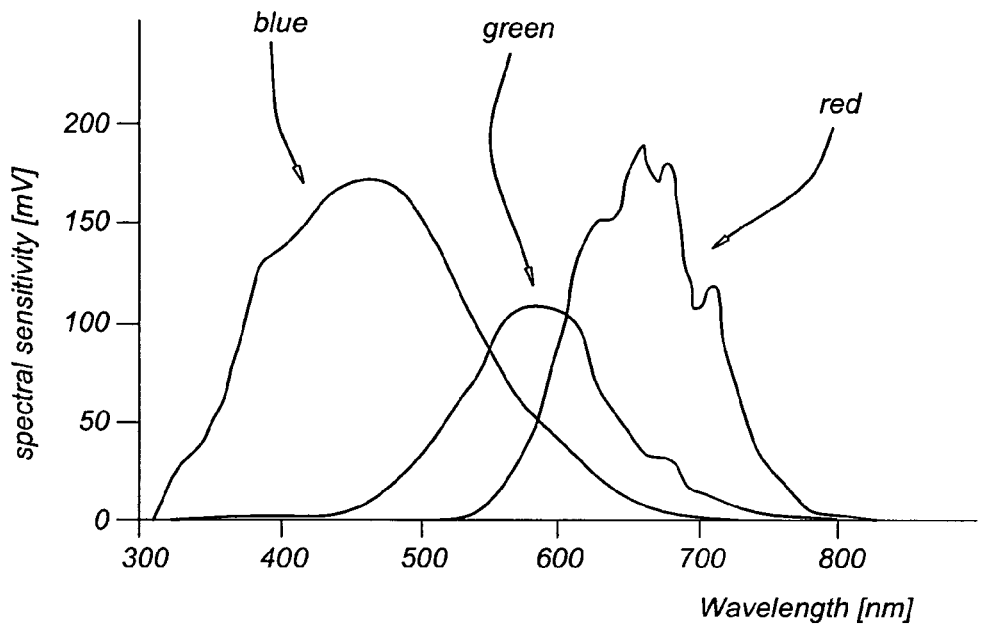

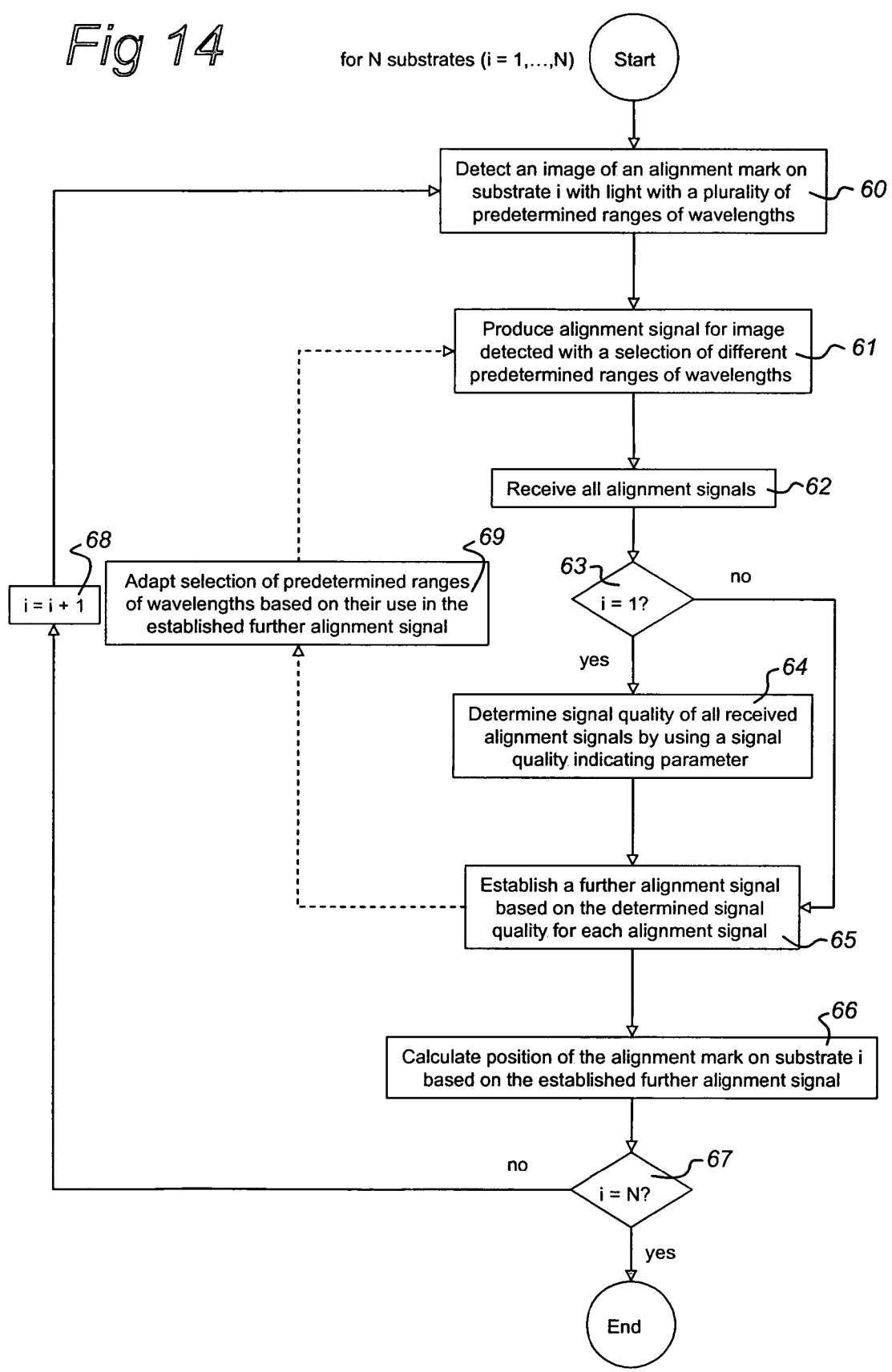

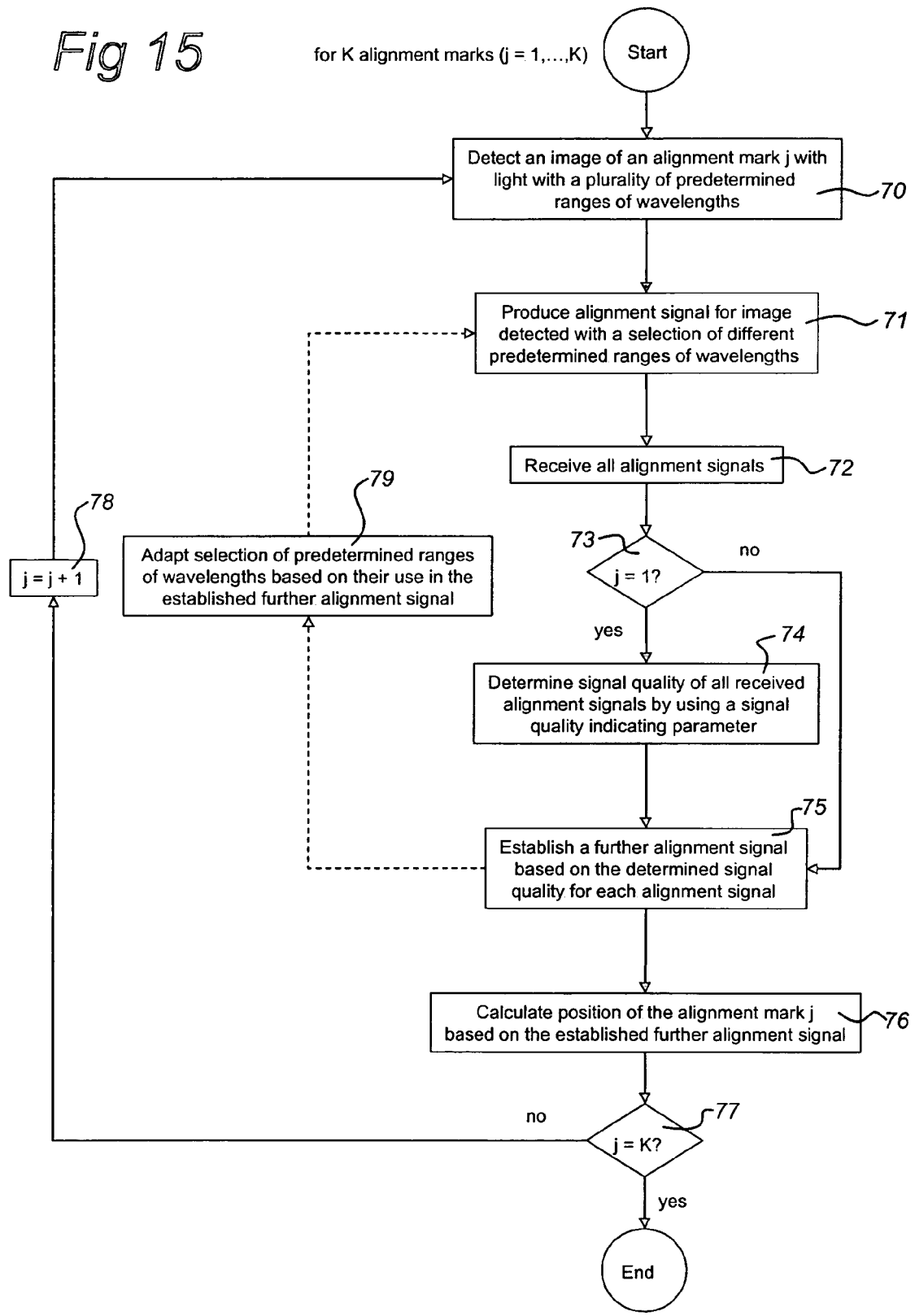

ALIGNMENT MEASUREMENT ARRANGEMENT AND ALIGNMENT MEASUREMENT METHOD

1. FIELD

The present invention relates to a lithographic apparatus and a method for manufacturing a device.

2. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Lithographic apparatus are known to use multiple alignment arrangements. Reference is, e.g., made to K. Ota et al., New Alignment Sensors for Wafer Stepper, SPIE, Vol. 1463, Optical/Laser Microlithography IV (1991), p. 304-314, and N. R. Farrar et al., Performance of through-the-lens/off-axis laser alignment systems and alignment algorithms on Nikon wafer steppers, SPIE Vol. 1673, Integrated Circuit Metrology, Inspection, and Process Control VI (1992), p. 369-380. All of the alignment arrangements use their own, distinct marks on, e.g., a substrate to be exposed and/or a substrate table supporting the substrate.

3. SUMMARY

It is desirable to provide an alignment arrangement with an improved performance in view of the prior art.

To that end, in a first embodiment, the invention provides an alignment measurement arrangement comprising a broadband source arranged to generate a radiation beam with at least a first and second range of wavelengths; an optical system arranged to receive said radiation beam as generated, to produce an alignment beam, to direct said alignment beam to at least one mark located on an object, to receive alignment radiation back from said at least one mark and to transmit said alignment radiation; a detector arranged to receive said alignment radiation and to detect an image of said at least one alignment mark located on said object and to produce at least a first and second alignment signal, respectively, associated with said first and second range of wavelengths, respectively; and a processor connected to said detector wherein said processor is arranged to receive said first and second alignment signal; determine a first and second signal quality respectively of said first and second alignment signal, respectively, by using at least one signal quality indicating parameter; establish a further alignment signal from said first and second alignment signal based on said first and second signal quality; and calculate a position of said at least one alignment mark based on said further alignment signal.

In a second embodiment, the invention provides an alignment measurement arrangement comprising a broadband source arranged to generate a radiation beam with a first, second and third range of wavelengths; an optical system arranged to receive said radiation beam as generated, to produce an alignment beam, to direct said alignment beam to at least one mark located on an object, to receive alignment radiation back from said at least one mark and to transmit said alignment radiation; a CCD-camera provided with a spatial filter to receive said alignment radiation and to detect an image of said at least one alignment mark located on said object, said spatial filter being arranged to divide the image of said at least one alignment mark as detected in a first, second and third further image with a lower resolution, respectively, associated with alignment radiation with said first, second and third range of wavelengths, and to produce at least a first, second and third alignment signal, respectively, associated with said first, second and third range of wavelengths, respectively; and a processor connected to said detector wherein said processor is arranged to receive said first, second and third alignment signal; determine a first, second and third signal quality respectively of said first, second and third alignment signal respectively by using at least one signal quality indicating parameter; establish a further alignment signal from said first, second and third alignment signal based on said first, second and third signal quality; and calculate a position of said at least one alignment mark based on said further alignment signal.

Moreover, the present invention provides an alignment measurement method in a lithographic apparatus, comprising detecting an image of at least one alignment mark located on an object upon illumination with radiation having at least a first and second range of wavelengths by a detector; producing at least a first and second alignment signal by the detector, respectively, associated with the image as detected with said first and second range of wavelengths, respectively; receiving said first and second alignment signal by a processor; determining a first and second signal quality, respectively, of said first and second alignment signal, respectively, by using at least one signal quality indicating parameter by the processor; and calculating a position of said at least one alignment mark based on said first and second signal quality by the processor.

In another embodiment of the invention, a lithographic apparatus is arranged to transfer a pattern from a patterning device onto a substrate, the lithographic apparatus comprising a broadband source arranged to generate a radiation beam with at least a first and second range of wavelengths; an optical system arranged to receive said radiation beam as generated, to produce an alignment beam, to direct said alignment beam to at least one mark located on an object, to receive alignment radiation back from said at least one mark and to transmit said alignment radiation; a detector arranged to receive said alignment radiation and to detect an image of said at least one alignment mark located on said object and to produce at least a first and second alignment signal, respectively, associated with said first and second range of wavelengths, respectively; and a processor connected to said detector wherein said processor is arranged to receive said first and second alignment signal; determine a first and second signal quality respectively of said first and second alignment signal, respectively, by using at least one signal quality indicating parameter; establish a further alignment signal from said first and second alignment signal based on said first and second signal quality; calculate a position of said at least one alignment mark based on said further alignment signal; establish a position signal based on the position of said at least one alignment mark as calculated; an actuator connected to said processor that is arranged to receive said position signal; calculate a position correction based on said position signal as received; and establish a position correction signal; a support structure arranged to support said substrate to be aligned, said support structure being connected to said actuator; wherein said actuator is arranged to move said support structure in response to said position correction signal as established.

4. BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 8:
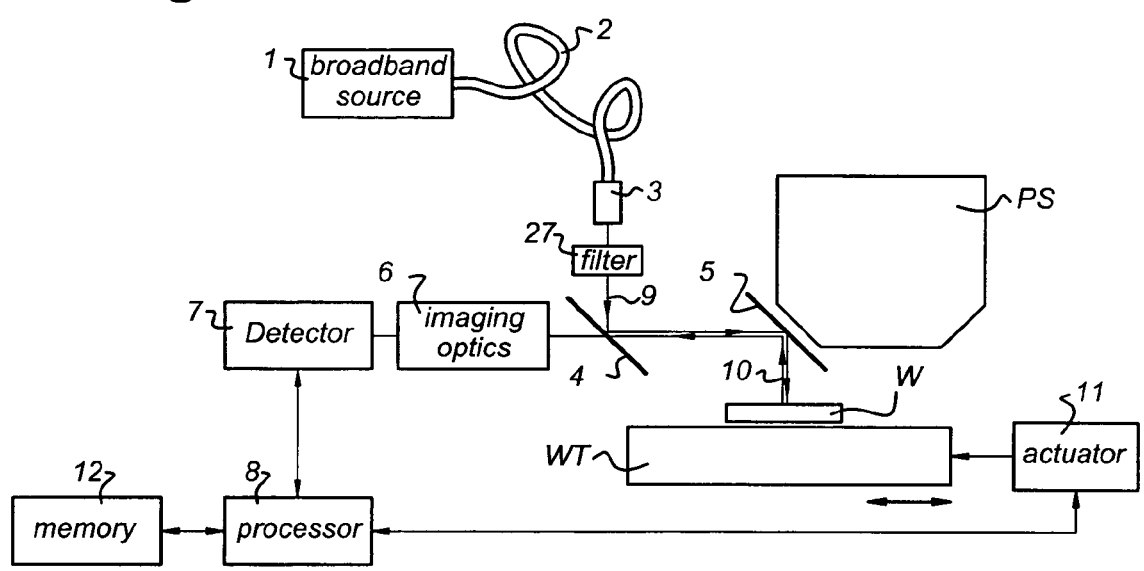
Figure 9A:
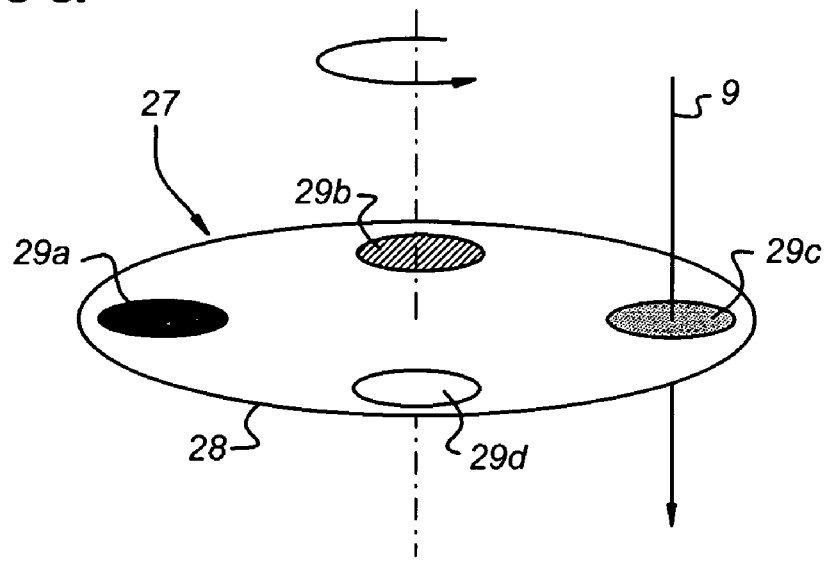
Figure 9B:
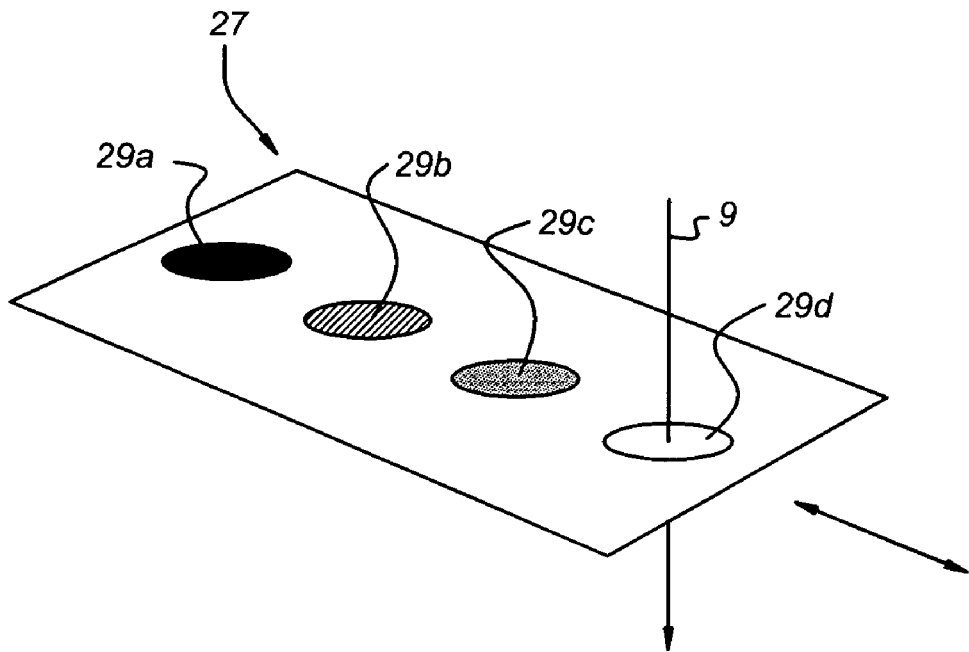
Figure 12:
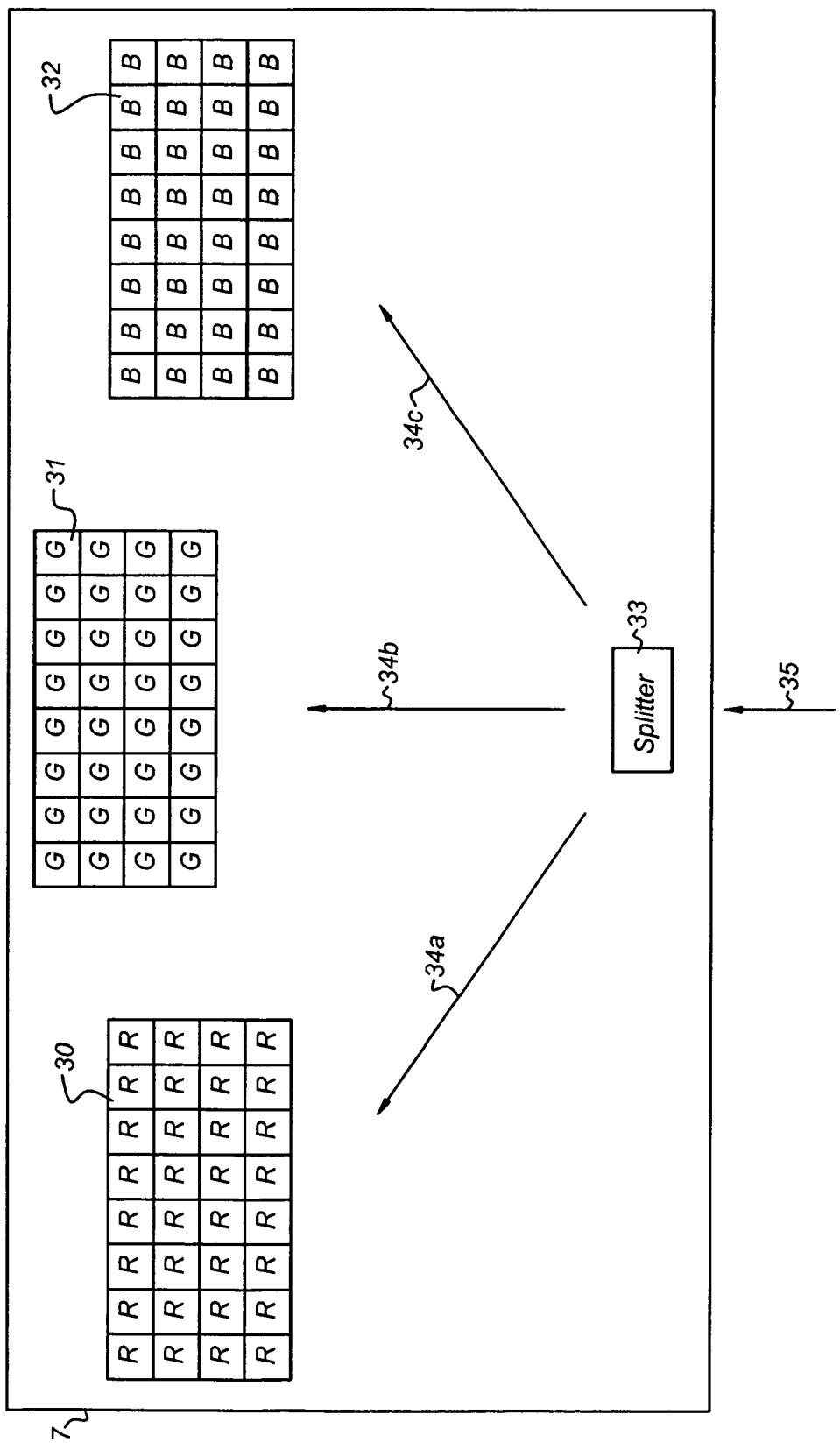
Figure 13:
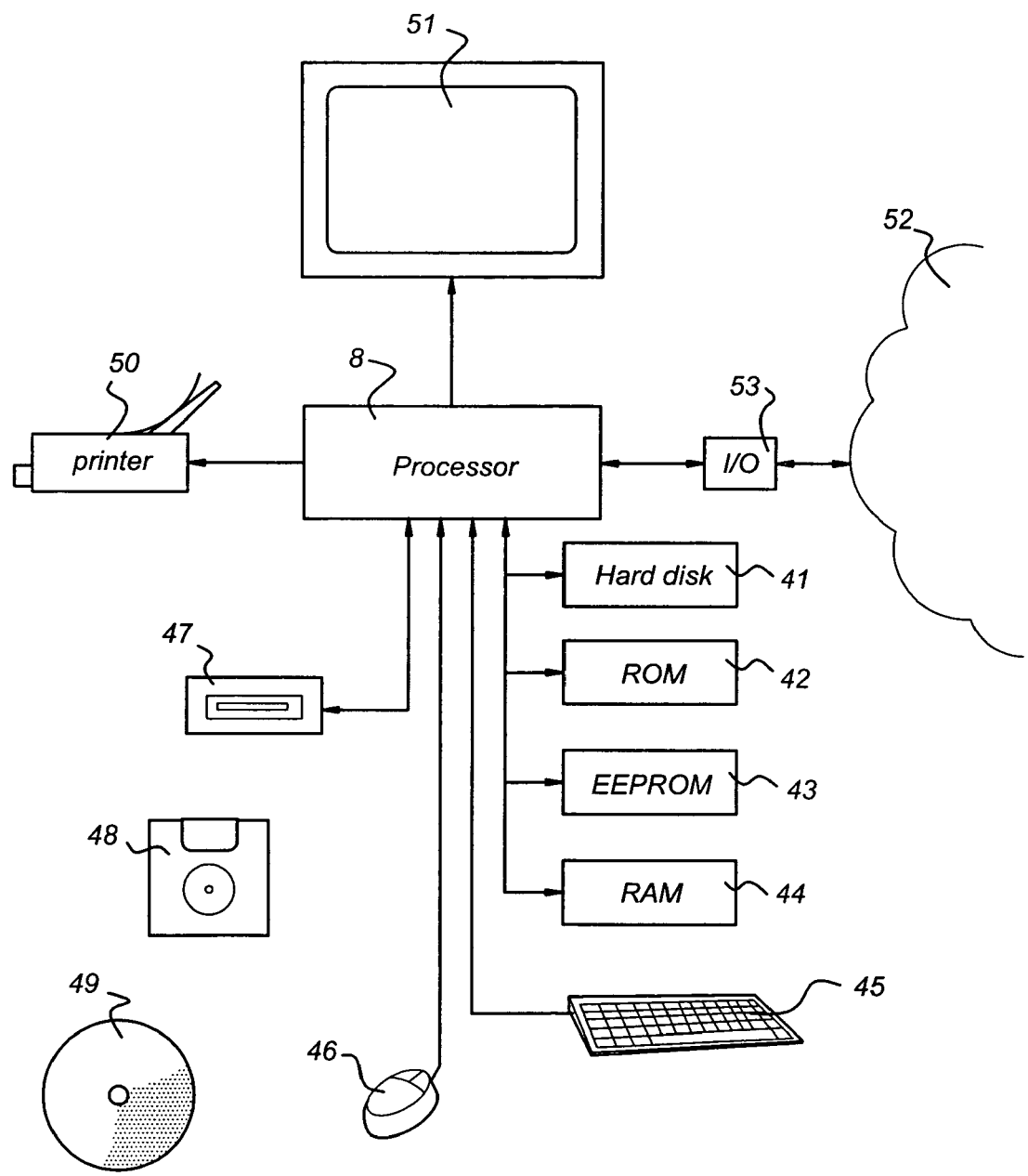

FIG. 8 schematically shows a field image alignment arrangement according to an embodiment of the invention;

FIGS. 9a, 9b schematically show two examples of filter units that can be used in the alignment arrangement of FIG. 8;

FIG. 10 shows a graph that provides information regarding the spectral sensitivity of a multicolor CCD-camera;

FIGS. 11a, 11b show two examples of spatial filters that can be employed in a CCD-camera;

FIG. 12 shows an embodiment of a detector suitable for use with the present invention;

FIG. 13 shows a computer comprising a processor as used in embodiments of the invention;

FIG. 14 shows a flow chart of an alignment measurement method according to a third embodiment of the invention;

FIG. 15 shows a flow chart of an alignment measurement method according to a fourth embodiment of the invention.

5. DETAILED DESCRIPTION

Figure 1:
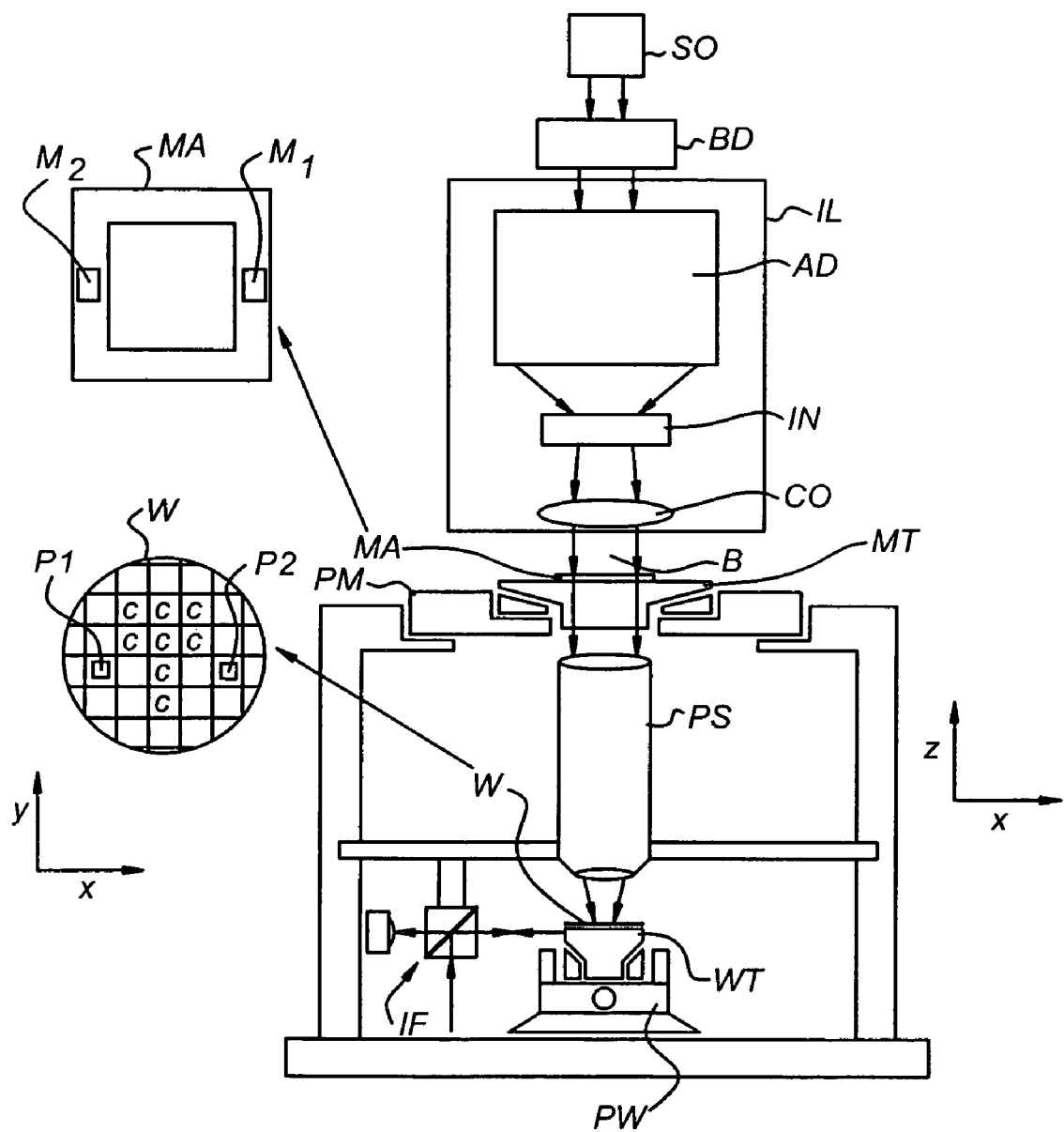
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or EUV-radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
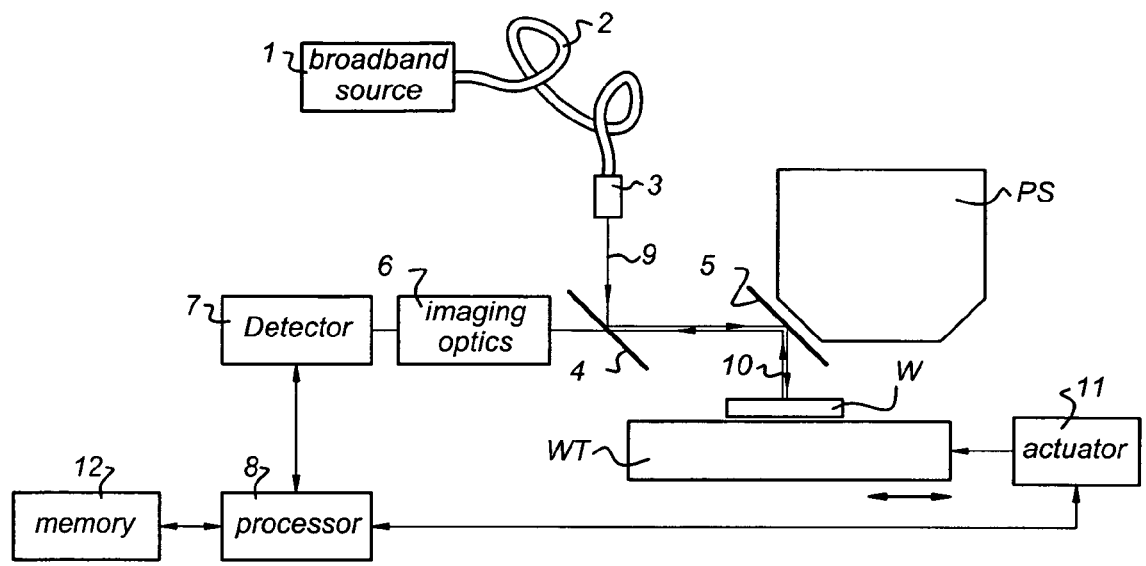
FIG. 2 shows a schematic example of a field image alignment arrangement.

FIG. 2 shows a schematic example of a field image alignment arrangement. Such an alignment arrangement is based on a static measurement. The field image alignment arrangement of FIG. 2 comprises a light source 1, which is a broadband source. The light source 1 is connected to one end of a fiber 2. A transmitter 3 is connected to the opposite end of the fiber 2. Optics to provide an alignment beam towards a mark M3 (cf. FIG. 3) on substrate W include a semi-transparent mirror 4 and a mirror 5. Imaging optics 6 are provided to receive alignment radiation back from the mark M3 and to provide a suitable optical image to a detector 7, e.g. a charged coupled device (CCD). The detector 7 is connected to a processor 8. The processor 8 in its turn is connected to an actuator 11 and a memory 12. The actuator 11 is connected to the substrate table WT, on which substrate W can be placed. In FIG. 2, both the processor 8 and the memory 12 are presented as separate units. The processor 8 and/or the memory 12 may however be physically located within the detector 7. Furthermore, either one of them may be part of a computer assembly as described with reference to FIG. 13.

In use, the light source 1 produces a broadband light beam that is output via the fiber 2 to the transmitter 3. The transmitter 3 provides a broadband light beam 9 that is reflected by mirror 4 to mirror 5. Mirror 5 produces a broadband alignment beam 10 to be directed to mark M3 on substrate W. The broadband light beam 10 impinging on the mark M3 is reflected back as alignment radiation to the mirror 5. The mirror 5 reflects the received light to the semi-transparent mirror 4 which passes at least a portion of the received light to the imaging optics 6. The imaging optics 6 is arranged to collect the received alignment radiation and to provide a suitable optical image to the detector 7. The detector 7 provides an output signal to the processor 8 that depends on the content of the optical image received from the imaging optics 6. The output signal that is received from the detector 7 as well as results of actions performed by the processor 8 may be stored in the memory 12. The processor 8 calculates a position of the alignment mark M3 based on one or more of the output signal it receives from the detector 7. It then provides a further output signal to the actuator 11. The actuator 11 is arranged to move substrate table WT. Upon reception of the further output signal the actuator 11 moves the substrate table WT towards a desired position.

Figure 3:
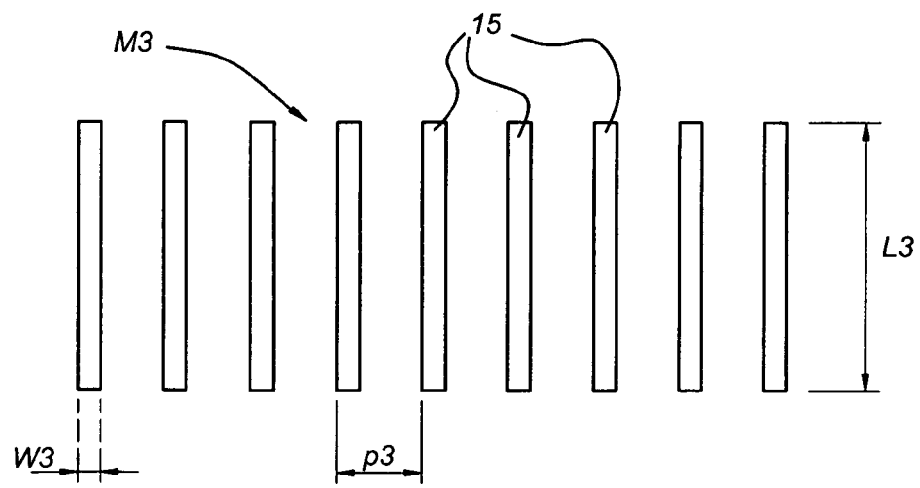
FIG. 3 shows an example of a mark that can be used in the alignment arrangement of FIG. 2.

FIG. 3 shows a top view of a mark M3 present on substrate W that can be used in the present invention. It comprises a plurality of bar-shaped structures 15 that have a width W3 and a length L3. Typical values for these dimensions are: W3=6 μm, L3=75 μm. The bar-shaped structures 15 have a pitch P3. A typical value for the pitch P3=12 μm.

Figure 4:
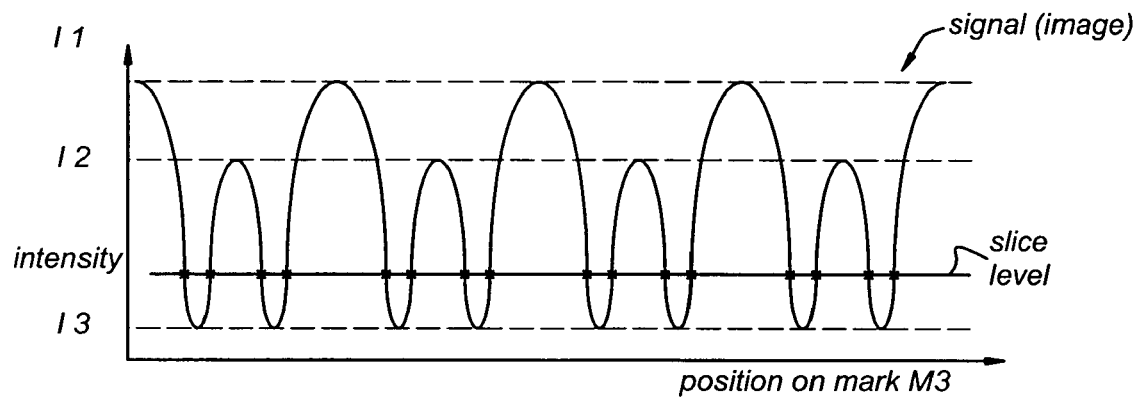
FIG. 4 shows an output signal of a detector used in the arrangement of FIG. 2 and receiving alignment radiation back from a mark.

FIG. 4 shows an output signal of the detector 7 that is transmitted to the processor 8 based on the optical image of the mark M3, as received from the imaging optics 6. Note that the output signal can take the form of a two-dimensional image that is transferred to the processor 8. The curve shown in FIG. 4 shows intensity of the signal as a function of position of the mark M3 while being illuminated with the broadband alignment beam 10. The curve shows absolute maxima at an intensity level of I1, local maxima with an intensity level of I2 and absolute minima with an intensity level of I3. The absolute maxima I1 are associated with the centers of the respective bar-shaped structures 15. The local maxima I2 are associated with the centers of the spaces between adjacent bar-shaped structures 15. The absolute minima I3 are associated with locations just beside transitions of the bar-shaped structures 15 towards the intermediate spaces between the bar-shaped structures 15. So, the slopes of the curve between absolute maxima I1 and local maxima I2 are due to transitions between the bar-shaped structures 15. At these transitions, i.e. side faces of the bar-shaped structures 15, only little light is reflected.

Thus the detector 7 receives a 2-D image of the mark M3. The output signal of the detector 7 to the processor 8 may only comprise 1-D information. It is however possible to transfer the 2-D image to the processor 8, and determine the position based on this image using a certain algorithm. Various algorithms can be used to arrive at an intensity signal as shown in FIG. 4 from the received image information. For example, the detector 7 may be a CCD with CCD-elements arranged in columns and rows, where the signals received by the CCD-elements in a column are averaged. For further details, the reader is referred to the article by Ota in SPIE Vol. 1463, referred to above.

Furthermore, various algorithms can be used to arrive at an alignment position based on the intensity signal shown in FIG. 4. One algorithm uses a slice level as shown in FIG. 4. An intensity value in between I1 and I3 is selected, based on this selected value (slice level) a location of mark M3 is determined.

Figure 5:
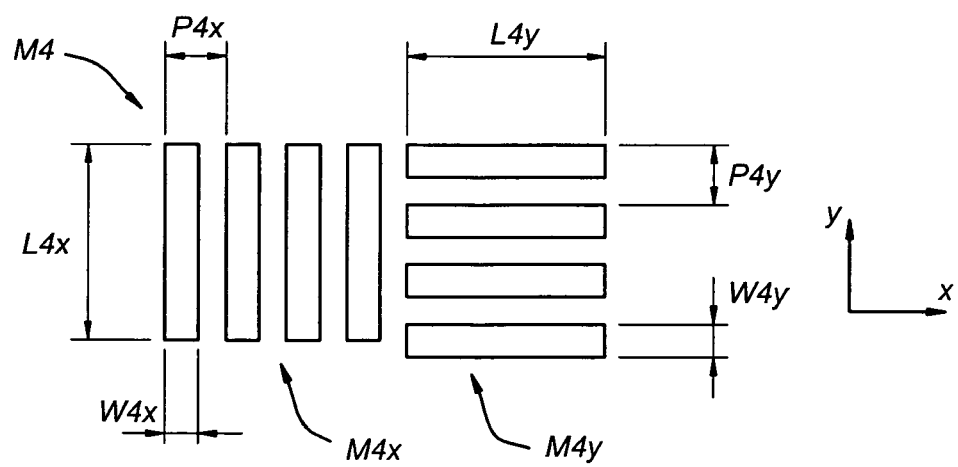
FIGS. 5 and 6 show further examples of marks that can be used in the arrangement of FIG. 2.
Figure 6:
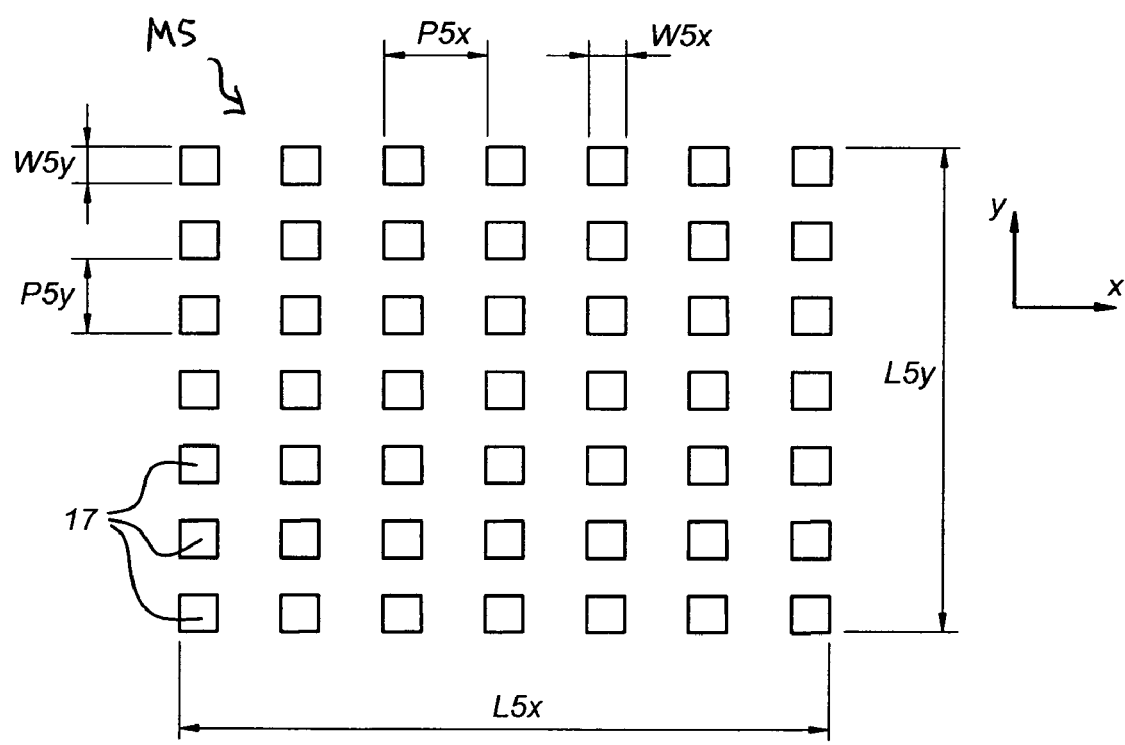

FIGS. 5 and 6 show alternative marks M4 and M5 respectively that can be used in the present invention. The alignment mark M4 as shown in FIG. 5 has a mark portion M4x for measuring a position in an x-direction and a mark portion M4y for measuring a position in a y-direction. The mark portion M4x is similar to the mark M3. It comprises a plurality of bar-shaped structures with a width W4x, a length L4x, and a pitch P4x. The mark portion M4y is similar to the mark portion M4x, but rotated by 90°. The mark portion M4y comprises bar-shaped structures with a width W4y, a length L4y, and a pitch P4y. The widths W4x, W4y, the lengths L4x, L4y, and the pitches P4x, P4y, respectively, have similar values as the width W3, the length L3, and the pitch P3 respectively of mark M3. When one wishes to measure a position in one direction only it is sufficient to provide only mark portion M4x or mark portion M4y. When such an alignment mark M4 is provided on the substrate table WT, the alignment mark M4 can also be used for on-line calibration purposes.

FIG. 6 shows another example of an alignment mark M5 that can be used in the present invention. The alignment mark has a plurality of columns. In each column a plurality of square shaped structures 17 are located. The square shaped structures 17 have a width W5x in the x-direction and a width W5y in the y-direction. The length of the mark M5 in the x-direction is L5x and the length of the mark M5 in the y-direction is L5y. The mark M5 has a pitch P5x between adjacent columns in the x-direction and a pitch P5y between the rows in the y-direction. Typical values of the widths W5x, W5y are 4 μm. Typical values for the lengths L5x, L5y are 40-100 μm. Typical values for pitches P5x, P5y are 8 μm. When used in the alignment arrangement of FIG. 2, an intensity signal similar to the one shown in FIG. 4 will be produced by detector 7 for processor 8. The mark M5 could be less optimal than the mark M3 or M4 due to a poorer signal/noise ratio. However, due to the use of a broadband light source 1, this is anticipated to be a minor problem, since the use of a broadband light source 1 results in constructive interference at some portion of the used bandwidth. Moreover, note that the alignment mark M5 can, in principle, also be used in both the x-direction and the y-direction.

In semiconductor processes, alignment marks are altered in various ways. Among others, the contrast due to interference may be deteriorated as a result of these mark alterations, an effect that may lead to alignment errors. The decrease of contrast depends on the wavelength of the illumination light. In case height variations within a mark correspond to a phase depth of $\lambda/2$, destructive interference will be present, i.e. the mark acts as a flat mirror. In this case no contrast will be detected, since all light will be diffracted in the zero-th order. Furthermore, light will be diffracted into higher orders for phase depths unequal to $\lambda/2$.

In a field image alignment arrangement, generally a broadband illumination source is used, as shown in FIG. 2. Although some wavelengths will destructively interfere, other wavelengths within the range of wavelengths generated by the broadband illumination source will constructively interfere. Therefore, there will always be constructive interference, i.e. there is always contrast in an alignment signal established by the detector upon detection of an image of the alignment mark, which is illuminated with broadband radiation. Alignment systems employing field image alignment utilize a fixed illumination bandwidth, generally between 530 and 650 nm, detect a fixed amount of diffraction orders and integrate all wavelengths on a single detector, that provides an image of the alignment mark. The accuracy of such an alignment system is limited.

Figure 7A:
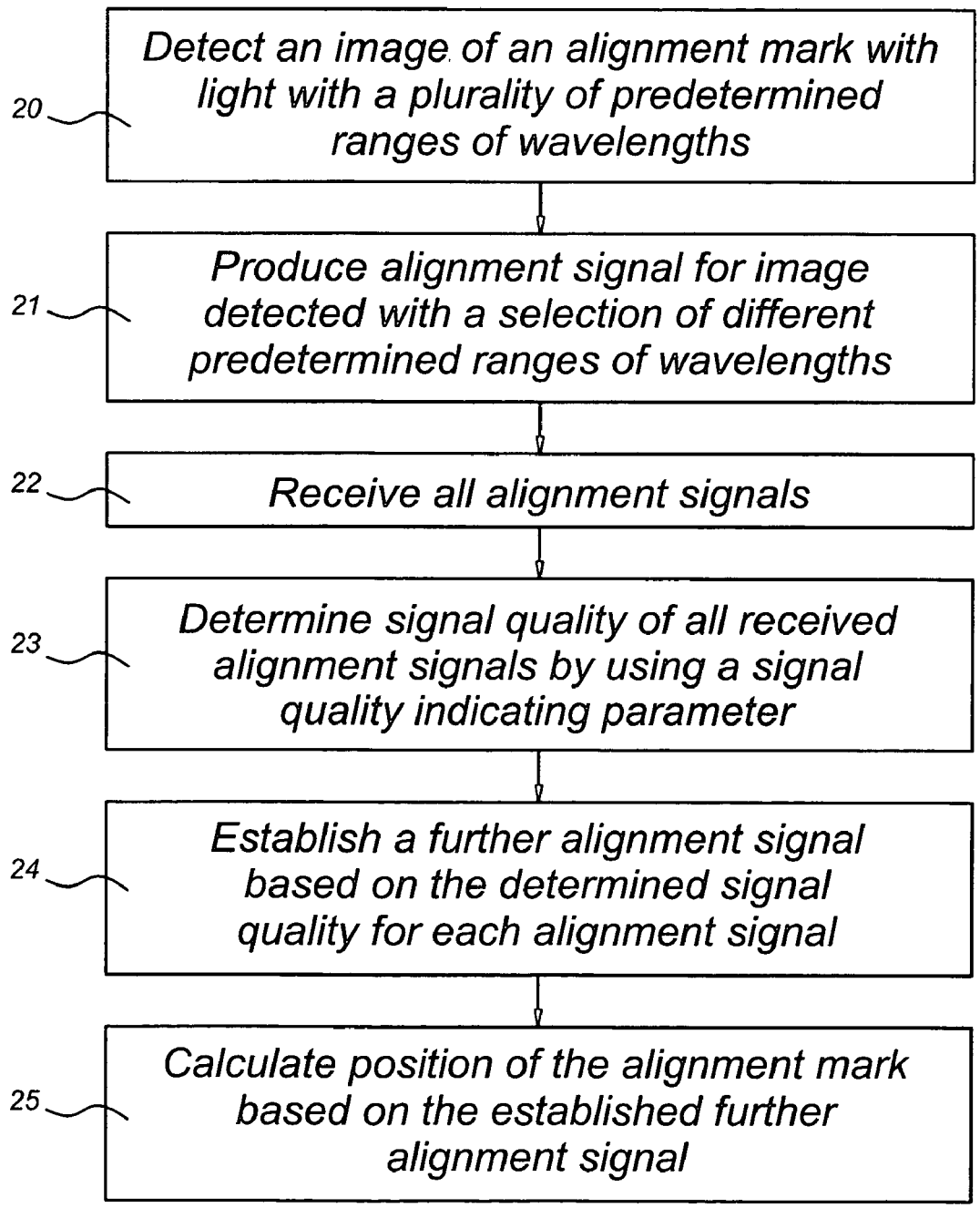
FIGS. 7a, 7b show flow charts of an alignment measurement method in accordance with a first and second embodiment of the invention.
Figure 7B:
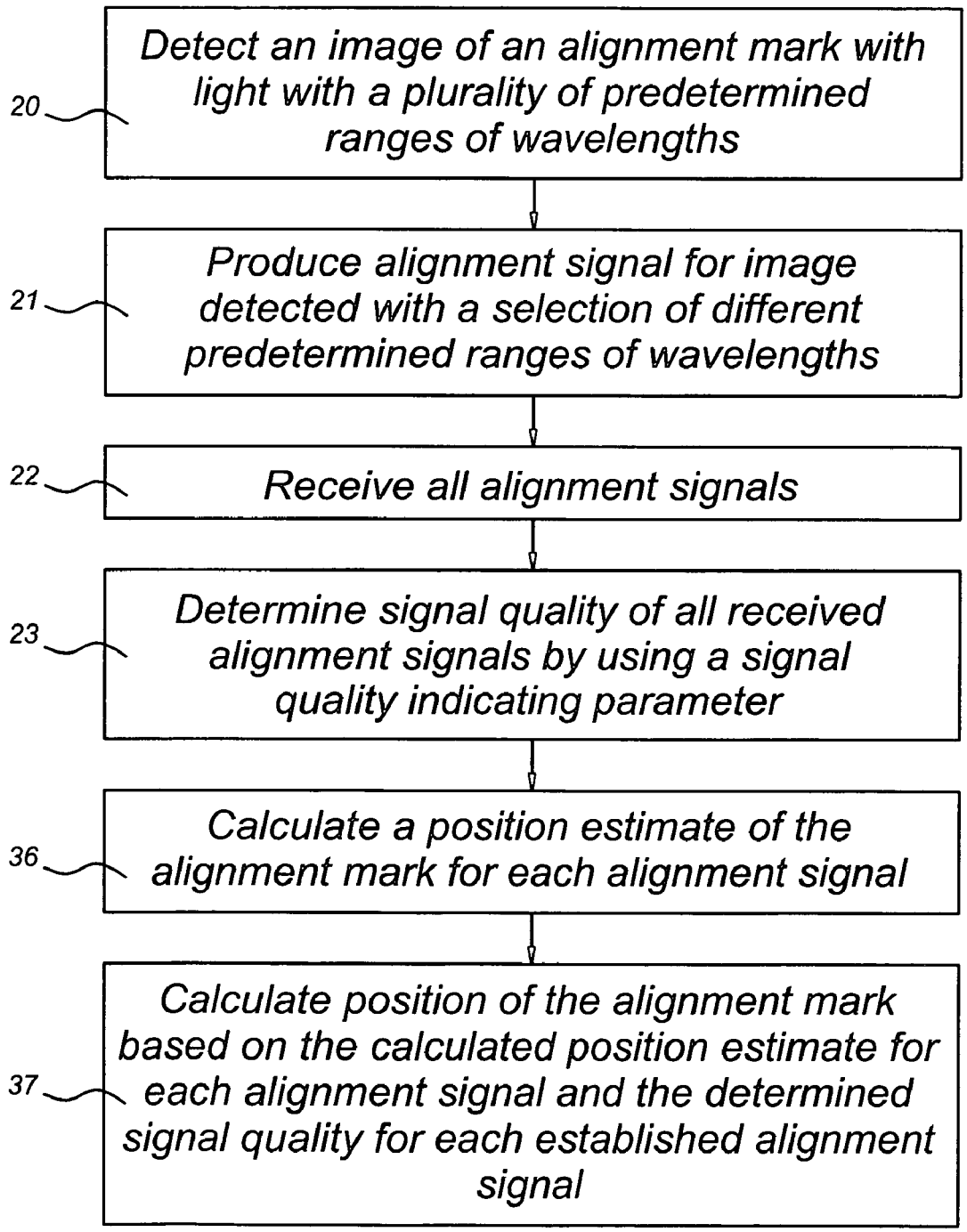

FIGS. 7a, 7b show flow charts of an alignment measurement method in accordance with a first and second embodiment of the invention, respectively. This alignment method can be performed with the field image alignment arrangement shown in FIG. 2. In both flow charts, the detector 7 first detects in action 20 an image of an alignment mark that has been illuminated with radiation having a plurality of predetermined ranges of wavelengths, e.g. alignment beam 10. Upon detection, the detector 7 produces in action 21 a selection of alignment signals, i.e. each alignment signal relates to a detected image of the at least one alignment mark that is formed by a different predetermined range of wavelengths. The selection of alignment signals can be obtained by consecutively illuminating the at least one alignment mark with a different predetermined selected range of wavelengths, for example by consecutively applying different types of filters to filter the broadband light beam 9 generated by the broadband source 1, each filter being designed to pass only a predetermined range of wavelengths. Examples of filter units comprising a number of filters are schematically shown in FIGS. 9a, 9b. In another embodiment, the images for different predetermined ranges of wavelengths are obtained by providing a detector 7 that can measure aforementioned ranges in parallel as will be explained later. The alignment signals produced by the detector 7 are received by processor 8 in action 22. Then, the signal quality of all produced alignment signals is determined in action 23 by using one or more quality indicating parameters. Examples of such quality indicating parameters include signal strength, noise level and fit quality of the alignment signal. The signal quality of the alignment signals can automatically be determined by processor 8, as will be evident to persons skilled in the art.

In a first embodiment, shown in FIG. 7a, the determined signal quality for each alignment signal is then used to establish in action 24 a further alignment signal. In an embodiment, the further alignment signal is identical to the alignment signal with the best determined signal quality. In another embodiment, a weighing factor is assigned to each alignment signal, wherein the value of the weighing factor is based on the determined signal quality per alignment signal. The further alignment signal then corresponds to a weighted sum of all alignment signals. Finally, a position of the at least one alignment mark is calculated in action 25, based on the established further alignment signal. In case of a measurement on more than one mark, i.e. a multiple mark measurement, the actions 24 and 25 can be performed per mark resulting in a different weighted sum for each alignment mark. Actions 24 and 25 can also be performed automatically by processor 8, as will be evident to persons skilled in the art.

In a second embodiment, shown in FIG. 7b, a position estimate of the alignment mark is calculated for each alignment signal in action 36. Consecutively, based on both the calculated position estimate and the determined signal quality for each established alignment signal, processor 8 calculates a position of the alignment mark in action 37. Again, in case of a measurement on more than one mark, actions 36 and 37 can be performed per mark. This may result in a calculation of a position of each mark with a different weighted sum of the established alignment signals.

FIG. 8 schematically shows a field image alignment arrangement according to an embodiment of the invention. As compared to the field image alignment arrangement schematically shown in FIG. 2, the field image alignment arrangement of FIG. 8 comprises a filter unit 27. The filter unit 27 is arranged to provide the broadband light beam 9, and thus also broadband alignment beam 10, with a different predetermined selected range of wavelengths before impinging on the mark (not shown) on the substrate W. Note that the filter unit 27 may also be positioned at other positions in an optical pathway of the broadband light beam 9 between the broadband source 1 and the detector 7.

FIGS. 9a, 9b schematically show two examples of filter units that can be used in the alignment arrangement of FIG. 8. In FIG. 9a, a first example of a filter unit 27 is shown. This filter unit 27 comprises a rotatable wheel 28 with a number of filters 29a-d. The filters are used in an embodiment of the invention to enable action 21 of FIG. 7, as explained before. Each filter 29a-d absorbs a different portion of the range of wavelengths in the broadband light beam 9. Consequently, the broadband light beam, is provided with a different predetermined selected range of wavelengths.

FIG. 9b schematically shows a second example of a filter unit 27. Again the filter unit 27 comprises a number of filters 29a-d. However, in this case the filters are not arranged on a rotatable wheel 28, but on a strip 30 that can be moved in a one-dimensional direction substantially perpendicular to the direction of the broadband light beam 9 in FIG. 8. It will be evident to skilled persons in the art that filters 29a-d may also be arranged on other types of carriers. Moreover, in FIGS. 9a, 9b, four filters 29a-d are shown. It will be evident to skilled persons in the art that the number of filters may be unequal to four.

The filter unit 27 may be controlled manually or automatically with a processor. This processor is not necessarily processor 8 but may be so.

Instead of a filter unit 27, filters may be applied in detector 7. FIG. 10 shows a graph that provides information regarding spectral sensitivity of a multicolor CCD-camera used as detector 7. A CCD is provided with CCD-elements arranged in columns and rows, thus forming a detecting surface. The size of each element is in the order of a few microns. A multicolor CCD employs so-called filters to give individual elements a sensitivity to a predetermined range of wavelengths, i.e. the elements are (partly) sensitive to "blue", "green" and "red". Note that, as can be seen in the graph, the sensitivity of a multicolor CCD-element is not limited to one or two wavelengths but covers a range of wavelengths. Thus, a sensitivity to "red" means that the CCD-element is sensitive for a range of wavelengths in a reddish part of a visual light spectrum. The same accounts for a sensitivity to "blue" and "green". By detecting an image of a mark that has been illuminated with an alignment beam having a plurality of ranges of wavelengths with a multicolor CCD, e.g. three images of the mark can be obtained in parallel.

Two examples of filters that can be employed in a multicolor CCD are shown in FIGS. 11a, 11b. In FIG. 11a, the detecting surface is covered with a so-called Bayer-filter. In the shown embodiment, the Bayer filter has twice as many CCD-elements that are sensitive to "green" than CCD-elements that are sensitive to "blue" or "red" as this embodiment is widely used in CCD-cameras. It must be understood that it is also possible to provide a similar arrangement with twice as many "blue" CCD-elements than "green" or "red" CCD-elements, and an arrangement with twice as many "red" CCD-elements than "green" or "blue" CCD-elements. In FIG. 11b, the filter forms lines of CCD-elements that are sensitive to the same color. Note that many other arrangements are possible.

Instead of using a multicolor CCD, it is also possible to use a CCD as a detector 7 that comprises more than one monochromatic detecting surface 30, 31, 32, as schematically shown in FIG. 12. Alignment radiation 35 coming from the imaging optics 6 is split by a splitter 33 in at least two alignment radiation beams 34. In FIG. 12, the splitter 33 splits the alignment radiation in three alignment radiation beams 34a-c. Each alignment radiation beam 34a-c carries light with a different range of wavelengths. Each alignment radiation beam 34a-c may be detected with an associated detecting surface 30-32. Detecting surface 30 detects the image of the alignment mark that is formed with the range of wavelengths that is carried by alignment radiation beam 34a. Similarly, alignment radiation beam 34b forms an image of the alignment mark on detecting surface 31, and alignment radiation beam 34c forms an image of the alignment mark on detecting surface 32. In FIG. 12, detecting surface 30 is sensitive to "red", detecting surface 31 is sensitive to "green" and detecting surface 32 is sensitive to "blue", in which the sensitivity to a certain "color" has the same meaning as explained before.

It should be understood that a processor 8 as used throughout this text can be implemented in a computer assembly 40 as shown in FIG. 13. The memory 12 connected to processor 8 may comprise a number of memory components like a hard disk 41, Read Only Memory (ROM) 42, Electrically Erasable Programmable Read Only Memory (EEPROM) 43, Random Access Memory (RAM) 44. Not all aforementioned memory components need to be present. Furthermore, it is not essential that aforementioned memory components are physically in close proximity to the processor 8 or to each other. They may be located at a distance away The processor 8 may also be connected to some kind of user interface, for instance a keyboard 45 or a mouse 46. A touch screen, track ball, speech converter or other interfaces that are known to persons skilled in the art may also be used.

The processor 8 may be connected to a reading unit 47, which is arranged to read data from and under some circumstances store data on a data carrier, like a floppy disc 48 or a CDROM 49. Also DVD's or other data carriers known to persons skilled in the art may be used.

The processor 8 may also be connected to a printer 50 to print out output data on paper as well as to a display 51, for instance a monitor or LCD (Liquid Crystal Display), of any other type of display known to a person skilled in the art.

The processor 8 may be connected to a communications network 52, for instance a public switched telephone network (PSTN), a local area network (LAN), a wide area network (WAN) etc. by means of transmitters/receivers 53 responsible for input/output (I/O). The processor 8 may be arranged to communicate with other communication systems via the communications network 52. In an embodiment of the invention external computers (not shown), for instance personal computers of operators, can log into the processor 8 via the communications network 52.

The processor 8 may be implemented as an independent system or as a number of processing units that operate in parallel, wherein each processing unit is arranged to execute sub-tasks of a larger program. The processing units may also be divided in one or more main processing units with several subprocessing units. Some processing units of the processor 8 may even be located a distance away of the other processing units and communicate via communications network 52.

FIG. 14 schematically shows a flow chart according to a second embodiment of the present invention. In this embodiment, not a single substrate but a batch of substrates, i.e. a batch of N substrates, i=1, . . . , N, as shown in FIG. 14, need to be aligned consecutively. Aforementioned embodiment of the method is employed to measure the position of alignment marks on the individual substrates within the batch of substrates. All substrates i are thus aligned by measuring on at least one alignment mark per substrate i.

With respect to the first out of N substrates, i.e. i=1, the alignment measurement method corresponds to the method shown in and explained with reference to FIG. 7. Thus first, in action 60, an image of an alignment mark on the first substrate, i.e. i=1, is detected with light with a plurality of predetermined ranges of wavelengths by a detector 7. Consecutively, in action 61, for each selected range of wavelengths out of said plurality of predetermined ranges of wavelengths, alignment signals are produced with respect to the detected image with that selected range of wavelengths. All produced alignment signals are received by a processor in action 62. Consecutively, in action 63, it is verified whether the index of the substrate equals 1. When this is the case, the method continues with action 64, in which the signal quality of all received alignment signals is determined by using a signal quality indication parameter. Examples of such quality indicating parameters include signal strength, noise level and fit quality of the alignment signal. The signal quality of the alignment signals can automatically be determined by processor 8, as will be evident to persons skilled in the art. The determined signal quality for each alignment signal is then used to establish in action 65 a further alignment signal. In an embodiment, the further alignment signal is identical to the alignment signal with the best determined signal quality. In another embodiment, a weighing factor is assigned to each alignment signal, wherein the value of the weighing factor is based on the determined signal quality per alignment signal. The further alignment signal then corresponds to a weighted sum of all alignment signals. Finally, a position of the at least one alignment mark is calculated in action 66, based on the established further alignment signal.

If there is only one substrate to be aligned, the aforementioned sequence would have come to an end, however, since there are N substrates to be aligned, after alignment of the first substrate out of N substrates, and in most cases after consecutive patterning of a pattern on this aligned first substrate, in action 67 it is verified if the last wafer has been aligned or not. Since so far only the first substrate is aligned and N substrates need to be aligned, the verification is negative and the index i is increased by 1 in action 68.

For the next substrate, i.e. i=1+1=2, the alignment measurement method again starts with action 60, i.e. an image of an alignment mark on the second substrate is detected with light with a plurality of predetermined ranges of wavelengths. Consecutively, actions 61 and 62, i.e. producing alignment signals by the detector 7 for each selected range of wavelengths and receiving all alignment signals by the processor 8 respectively, are also performed as described before. However, since the index number of the second substrate is unequal to 1, now in action 63 the verification gives a negative result. Consequently, action 64 is omitted and the further alignment signal is established by using the obtained signal quality of the alignment signals with respect to the first substrate. Thus, the alignment signals produced with respect to the second substrate are selected and weighed in a similar fashion as the alignment signals of the first substrate. Finally, in action 65, the position of the alignment mark on the second substrate is calculated on basis of the established further alignment signal.

Until the index number of substrates equals N, actions 68, 60, 61, 62, 63, 65 and 66 are repeated. For all substrates, the signal quality determined with respect to the alignment signals corresponding to the first substrate, is the basis of the establishing of the further alignment signal.

Aforementioned alignment measurement method can be further enhanced in case one or more of the alignment signals are not part of the further alignment signal, i.e. at least one of the aforementioned weighing factors equals zero. In that case, after establishing a further alignment signal in action 65, the processor, besides calculating the position of the alignment mark on substrate i in action 66, sends a feedback signal towards the detector 7 so the detector can adapt in action 69 the selection of predetermined ranges of wavelengths it should produce an alignment signal for in action 61. To emphasize that this embodiment is an enhancement, the arrows in the flow diagram of FIG. 14 related to this matter are dashed.

The adaptation is based on the use of the alignment signals in the established further alignment signal. Thus, if an alignment signal corresponding to a certain predetermined range of wavelength is not used to establish a further alignment signal for the first substrate, the adaptation in action 69 will cause the detector 7 to no longer produce that alignment signal.

It should be understood that in case a filter unit 27 is used, as shown in FIGS. 9a, 9b, such a feedback signal to adapt the selection of different predetermined ranges of wavelengths could also be sent to the control unit (not shown) of the filter unit 27. Consequently, the control unit of the filter unit 27 will no longer apply the filters 29a-d, of which the corresponding alignment signals, produced in action 61, are not used in the establishing of the further alignment signal in action 65, on alignment marks on further substrates i to be measured.

FIG. 15 shows a flow chart of an alignment measurement method according to a third embodiment of the invention. In this embodiment, a similar flow chart as depicted in FIG. 14 is used, however, the method is employed on a number of marks j (j=1, ..., M) instead of a number of substrates.

With respect to the first out of K marks, i.e. j=1, the alignment measurement method corresponds to the method shown in and explained with reference to FIG. 7. Thus first, in action 70, an image of the first alignment mark, i.e. j=1, is detected with light with a plurality of predetermined ranges of wavelengths by a detector 7. Consecutively, in action 71, for each selected range of wavelengths out of said plurality of predetermined ranges of wavelengths, alignment signals are produced with respect to the detected image with that selected range of wavelengths. All produced alignment signals are received by a processor in action 72. Consecutively, in action 73, it is verified whether the index of the mark equals 1, i.e. j=1. When this is the case, the method continues with action 74, in which the signal quality of all received alignment signals is determined by using a signal quality indication parameter. Examples of such quality indicating parameters include signal strength, noise level and fit quality of the alignment signal. The signal quality of the alignment signals can automatically be determined by processor 8, as will be evident to persons skilled in the art. The determined signal quality for each alignment signal is then used to establish in action 75 a further alignment signal. In an embodiment, the further alignment signal is identical to the alignment signal with the best determined signal quality. In another embodiment, a weighing factor is assigned to each alignment signal, wherein the value of the weighing factor is based on the determined signal quality per alignment signal. The further alignment signal then corresponds to a weighted sum of all alignment signals. Finally, a position of the first alignment mark is calculated in action 76, based on the established further alignment signal.

If there was only one mark to be measured upon, aforementioned sequence would have come to an end, however, since there are K marks to be measured, after measurement of the first mark out of K marks, it is verified, in action 77, whether the last mark has been measured or not, i.e. whether j=K. In the case that only the first mark is measured, as is the case so far, and K marks need to be aligned, the verification is negative and the index j is increased by 1 in action 78.

For the next substrate, i.e. j=1+1=2, the alignment measurement method again starts with action 70, i.e. an image of an alignment mark, i.e. the second alignment mark, is detected with light with a plurality of predetermined ranges of wavelengths. Consecutively, actions 71 and 72, i.e. producing alignment signals by the detector 7 for each selected range of wavelengths and receiving all alignment signals by the processor 8 respectively, are also performed as described before. However, since the index number of the second mark is unequal to 1, now in action 73 the verification gives a negative result. Consequently, action 74 is omitted and the further alignment signal is established by using the obtained signal quality of the alignment signals with respect to the first alignment mark. Thus, the alignment signals produced with respect to the second alignment mark are selected and weighed in a similar fashion as the alignment signals of the first alignment mark. Finally, in action 75, the position of the alignment mark is calculated on basis of the established further alignment signal.

Until the index number of marks equals K, actions 78, 70, 71, 72, 73, 75 and 76 are repeated. For all alignment marks, the signal quality determined with respect to the alignment signals corresponding to the first alignment mark, is the basis of the establishing of the further alignment signal.

Aforementioned alignment measurement method can be further enhanced in case one or more of the alignment signals are not part of the further alignment signal, i.e. at least one of the aforementioned weighing factors equals zero. In that case, after establishing a further alignment signal in action 75, the processor, besides calculating the position of the alignment mark j in action 76, sends a feedback signal towards the detector 7 so the detector can adapt in action 79 the selection of predetermined ranges of wavelengths it should produce an alignment signal for action 71. To emphasize that this embodiment is an enhancement, the arrows in the flow diagram of FIG. 15 related to this matter are dashed.

The adaptation is based on the use of the alignment signals in the established further alignment signal. Thus, if an alignment signal corresponding to a certain predetermined range of wavelengths is not used to establish a further alignment signal for the first mark, the adaptation in action 79 will cause the detector 7 to no longer produce that alignment signal.

It should be understood that in case a filter unit 27 is used, as shown in FIGS. 9a, 9b, such a feedback signal to adapt the selection of different predetermined ranges of wavelengths could also be sent to the control unit (not shown) of the filter unit 27. Consequently, the control unit of the filter unit 27 will no longer apply the filters 29a-d, of which the corresponding alignment signals, produced in action 61, are not used in the establishing of the further alignment signal in action 65, on further alignment marks j to be measured.

It should be noted that not all alignment marks j=1, ..., K need to be present on a single substrate. It may thus be that in a batch of substrates, on each substrate a position of one or more marks is measured by employing the way of selecting and/or weighing alignment signals with respect to a first alignment mark on a first wafer for the establishing of a further alignment signal with respect to an image of a further mark that can be positioned on a further wafer.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The terms "broadband light" and "broadband illumination" used herein encompass light with multiple ranges of wavelengths, including wavelengths within the visible spectrum as well as in the infrared regions. Furthermore, it must be understood that the multiple ranges of wavelengths not necessarily join together.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Although the arrangement as shown with reference to FIG. 2 shows that actuator 11 moves substrate table WT so as to create a movement of alignment beam 10 across substrate W, it should be understood that alignment beam 10 may be moved by suitable devices, e.g., by a mirror actuated to sweep alignment beam 10 across substrate W. Then, the substrate table WT and thus substrate W would remain on a fixed location. Alternatively, in another embodiment, both the substrate table WT and the alignment beam 10 may be moving while performing the measurement.

The descriptions above are intended to be illustrative, not limiting. Thus, it will be apparent to one skilled in the art that modifications may be made to the invention as described without departing from the scope of the claims set out below.

I claim:

1. An alignment measurement arrangement comprising:
a broadband source arranged to generate a radiation beam with at least a first and second range of wavelengths;
an optical system arranged to receive said radiation beam as generated, to produce an alignment beam, to direct said alignment beam to an alignment mark located on an object, to receive alignment radiation back from said at least one mark and to transmit said alignment radiation;
a detector arranged to receive said alignment radiation and to detect an image of said alignment mark located on said object and to produce at least a first and second alignment signal for the alignment mark associated with said first and second range of wavelengths, respectively; and
a processor connected to said detector wherein said processor is arranged to:
receive said first and second alignment signal;
determine a first and second signal quality respectively of said first and second alignment signal, respectively, by using at least one signal quality indicating parameter;
establish a further alignment signal from said first and second alignment signal based on said first and second signal quality; and
calculate a position of said alignment mark based on said further alignment signal.

2. The alignment measurement arrangement of claim 1, wherein said alignment measurement arrangement further comprises a memory connected to said processor, said memory being arranged to store said first and second alignment signal produced by said detector, and said processor being arranged to determine said first and second signal quality of the first and second alignment signals as stored.

3. The alignment measurement arrangement of claim 2, wherein said memory is further arranged to store the first and second signal quality of said first and second alignment signal and said processor is arranged to establish said further alignment signal from said first and second alignment signal as stored, based on the first and second signal quality of said first and second alignment signal as stored.

4. The alignment measurement arrangement of claim 1, wherein the optical system comprises a filter unit arranged to adapt the alignment beam, the filter unit comprising a number of filters, each filter being arranged to provide the alignment beam with a different predetermined selected range of wavelengths.

5. The alignment measurement arrangement of claim 4, wherein the filter unit comprises a rotatable wheel with a number of filters.

6. The alignment measurement arrangement of claim 1, wherein said optical system comprises a radiation splitter to split the alignment radiation in at least a first and second alignment radiation beam, the first and second alignment radiation beams having radiation with different predetermined selected ranges of wavelengths.

7. The alignment measurement arrangement of claim 6, wherein said detector comprises at least a first and second detecting surface, respectively, arranged to detect said first and second alignment radiation beam, respectively.

8. The alignment measurement arrangement of claim 1, wherein said detector is provided with a spatial filter, said spatial filter being arranged to divide the image of said at least one alignment mark as detected in at least two further images with a lower resolution, each further image corresponding to detected alignment radiation with a different predetermined selected range of wavelengths.

9. The alignment measurement arrangement of claim 1, wherein said detector is a CCD-camera.

10. The alignment measurement arrangement of claim 9, wherein said CCD-camera is arranged to detect multiple ranges of wavelengths.

11. The alignment measurement arrangement of claim 10, wherein said CCD-camera is arranged to detect three ranges of wavelengths.

12. The alignment measurement arrangement of claim 11, wherein said three ranges of wavelengths correspond with red, green and blue.

13. The alignment measurement arrangement of claim 1, wherein said processor is further arranged to establish a position signal based on the position of said at least one alignment mark as calculated; and further comprising:
- an actuator connected to said processor that is arranged to:
  - receive said position signal;
  - calculate a position correction based on said position signal as received; and
  - establish a position correction signal.

14. A lithographic apparatus arranged to transfer a pattern from a patterning device onto a substrate, the lithographic apparatus comprising:
- a broadband source arranged to generate a radiation beam with at least a first and second range of wavelengths;
- an optical system arranged to receive said radiation beam as generated, to produce an alignment beam, to direct said alignment beam to an alignment mark located on an object, to receive alignment radiation back from said at least one mark and to transmit said alignment radiation;
- a detector arranged to receive said alignment radiation and to detect an image of said alignment mark located on said object and to produce at least a first and second alignment signal for the alignment mark associated with said first and second range of wavelengths, respectively; and
- a processor connected to said detector wherein said processor is arranged to:
  - receive said first and second alignment signal;
  - determine a first and second signal quality of said first and second alignment signal, respectively, by using at least one signal quality indicating parameter;
  - establish a further alignment signal from said first and second alignment signal based on said first and second signal quality;
  - calculate a position of said alignment mark based on said further alignment signal;
  - establish a position signal based on the position of said alignment mark as calculated;
- an actuator connected to said processor that is arranged to:
  - receive said position signal;
  - calculate a position correction based on said position signal as received; and
  - establish a position correction signal;
- a support structure arranged to support said substrate to be aligned, said support structure being connected to said actuator;
- wherein said actuator is arranged to move said support structure in response to said position correction signal as established.

15. A device manufacturing method comprising transferring a pattern from a patterning device onto a substrate using the lithographic apparatus as defined by claim 14.

16. An alignment measurement method in a lithographic apparatus, comprising:
- detecting an image of an alignment mark located on an object upon illumination with radiation having at least a first and second range of wavelengths by a detector;
- producing at least a first and second alignment signal by the detector associated with the image as detected with said first and second range of wavelengths, respectively;
- receiving said first and second alignment signal by a processor;
- determining a first and second signal quality of said first and second alignment signal, respectively, by using at least one signal quality indicating parameter by the processor; and
- calculating a position of said alignment mark based on said first and second signal quality by the processor.

17. The alignment measurement method of claim 16, wherein, after said determining, the method further comprises establishing a further alignment signal from said first and second alignment signal based on said first and second signal quality by the processor, and calculating the position of said at least one alignment mark based on said further alignment signal by the processor.

18. The alignment measurement method of claim 17, wherein said further alignment signal is established by selecting the alignment signal with a best signal quality.

19. The alignment measurement method of claim 16, wherein said further alignment signal is established by assigning at least a first and second weighing factor, respectively, to said first and second alignment signal, respectively, based on the first and second signal quality, respectively, as determined, and calculating a weighted sum of said first and second alignment signal.

20. The alignment measurement method of claim 16, wherein, after said determining, the method further comprises, calculating a first and second position estimate of said at least one alignment mark respectively for the first and second alignment signal, respectively, and calculating the position of said at least one alignment mark based on the first and second position estimate as calculated and the first and second signal quality as determined by the processor.

21. The alignment measurement method of claim 16, further comprising detecting the image, upon illumination with said first range of wavelengths, at a different point in time than the detection of the image upon illumination with said second range of wavelengths.

22. The alignment measurement method according to claim 16, wherein the detector comprises at least a first and second detecting surface and a radiation splitter, and said method further comprises splitting the radiation having at least a first and second range of wavelengths in at least a first and second alignment radiation beam by using the radiation splitter, the first and second alignment radiation beams having radiation with different predetermined selected ranges of wavelengths.

23. The alignment measurement method of claim 22, wherein detecting the image includes detecting the image of said at least one alignment mark formed with said first and second alignment radiation beam, respectively, on said first and second detecting surface, respectively.

24. The alignment measurement method of claim 18, further comprising aligning a second substrate by using the alignment signal with the best signal quality as selected.

25. The alignment measurement method of claim 19, further comprising aligning a second substrate by using the calculated weighted sum of said at least first and second alignment signal.

26. A computer program product comprising data and instructions to be loaded by a processor of a lithographic apparatus, and arranged to allow said lithographic apparatus to perform the alignment measurement method as defined in claim 16.

27. A data carrier comprising a computer program product as claimed in claim 26.

28. An alignment measurement arrangement comprising:
- a broadband source arranged to generate a radiation beam with a first, second and third range of wavelengths;
- an optical system arranged to receive said radiation beam as generated, to produce an alignment beam, to direct said alignment beam to an alignment mark located on an object, to receive alignment radiation back from said at least one mark and to transmit said alignment radiation;

a CCD-camera provided with a spatial filter to receive said alignment radiation and to detect an image of said at least one alignment mark located on said object, said spatial filter being arranged to divide the image of said alignment mark as detected in a first, second and third further image with a lower resolution, respectively, associated with alignment radiation with said first, second and third range of wavelengths, and to produce at least a first, second and third alignment signal, respectively, associated with said first, second and third range of wavelengths, respectively; and a processor connected to said detector wherein said processor is arranged to:
  receive said first, second and third alignment signal;
  determine a first, second and third signal quality of said first, second and third alignment signal, respectively, by using at least one signal quality indicating parameter;
  establish a further alignment signal from said first, second and third alignment signal based on said first, second and third signal quality; and
  calculate a position of said at least one alignment mark based on said further alignment signal.

* * * * *